United States Patent [19]
Terashima et al.

[11] Patent Number: 5,894,156
[45] Date of Patent: Apr. 13, 1999

[54] SEMICONDUCTOR DEVICE HAVING A HIGH BREAKDOWN VOLTAGE ISOLATION REGION

[75] Inventors: Tomohide Terashima; Kazuhiro Shimizu, both of Tokyo, Japan

[73] Assignee: Mitsubishi Denki Kabushiki Kaisha, Tokyo, Japan

[21] Appl. No.: 08/739,713

[22] Filed: Oct. 29, 1996

[30] Foreign Application Priority Data

Apr. 15, 1996 [JP] Japan .................... 8-092240

[51] Int. Cl.$^6$ .................................. H01L 27/092
[52] U.S. Cl. .................. 257/374; 257/492; 257/493; 257/389; 257/900
[58] Field of Search ........................ 257/374, 492, 257/493, 389, 336, 344, 408, 900

[56] References Cited

U.S. PATENT DOCUMENTS

| | | | |
|---|---|---|---|
| 4,292,642 | 9/1981 | Appels et al. | |
| 4,835,596 | 5/1989 | Werner | 257/492 |
| 4,868,921 | 9/1989 | Adler | 257/493 |
| 5,406,110 | 4/1995 | Kwon et al. | 257/493 |
| 5,585,660 | 12/1996 | Mei | 257/389 |

FOREIGN PATENT DOCUMENTS

| | | |
|---|---|---|
| 0 347 479 A1 | 12/1989 | European Pat. Off. . |
| 0 409 746 A1 | 1/1991 | European Pat. Off. . |
| 0 596 565 A2 | 5/1994 | European Pat. Off. . |

*Primary Examiner*—Carl W. Whitehead, Jr.
*Attorney, Agent, or Firm*—McDermott, Will, Emery

[57] ABSTRACT

A resurf structure is provided which includes an n type diffusion region surrounded by a n− diffusion region, in which a part of the joined combination of the n type diffusion region and the n− diffusion region is separated by a narrow p− substrate region in between. An aluminum lead is provided between the separated n− diffusion regions, and a signal is level shifted. A high voltage semiconductor device which includes a small area high voltage isolation region is obtained without process cost increase.

14 Claims, 11 Drawing Sheets

5,894,156

SEMICONDUCTOR DEVICE HAVING A HIGH BREAKDOWN VOLTAGE ISOLATION REGION

TECHNICAL FIELD

The present invention relates to a high voltage semiconductor device having a high breakdown voltage isolation region.

BACKGROUND ART

There is known a conventional high voltage semiconductor devices which includes a high breakdown voltage isolation region using a resurf structure (see, for example, U.S. Pat. No. 4,292,642). FIG. 12 is a sectional view of a conventional semiconductor device with a level shift function which uses a high breakdown voltage resurf structure. As shown in the figure, the semiconductor device consists of an n-channel resurf MOS FET shown in the left side of the figure, and a resurf isolation island region in the right side of the figure. The semiconductor device comprises a p– substrate 1, an n– epitaxial layer 2, a p– diffusion region 3 formed to reach the p– substrate 1, an n+ buried diffusion region 4, an n diffusion region 5, a p diffusion region 6, an oxide film 7, aluminum lead 8, a polysilicon gate 9, an aluminum electrode 10, and a polysilicon 11. The aluminum electrode 10 is formed in contact with the n diffusion region 5 and the p diffusion region 6, and has the same potential as that of the resurf isolation island. The polysilicon 11 has the same potential as that of the p diffusion region 3, and serves as a field plate. In addition, the n diffusion region 5 and the n+ buried diffusion region 4 constitute a resurf structure surrounded by the p diffusion region 3.

In the semiconductor device arranged as above, the n channel MOS FET is turned on by positively biasing the gate electrode 9. Thereby, a potential difference is caused between the electrode 10 and the aluminum lead 8 by a current flowing through the p diffusion region 6. Outputting this potential difference enables a logic signal applied to the gate 9 to be level shifted to a higher potential.

A problem in the structure of such conventional high voltage semiconductor devices lie in that, because the aluminum lead 8 at a high potential crosses over the p diffusion region 3 at the substrate potential, a depletion layer is prevented from extending between the n– epitaxial layer 2 and the p diffusion region 3, lowering the breakdown voltage. Countermeasures may be taken to prevent this problem, as shown in FIG. 12. One approach is to assure the extension of the depletion layer by forming field plates 11 with polysilicon or the like on the pn junction, or to form floating multiple field plates so as to stabilize the surface field with capacitive coupling (see, for example, U.S. Pat. No. 5,455,439). However, such approach has a problem. As the breakdown voltage is increased, it becomes necessary to considerably thicken an oxide film between the field plates 11 and the aluminum lead 8 to assure dielectric strength of the oxide film itself, thereby increasing the cost to process.

DISCLOSURE OF THE INVENTION

The present invention is intended to eliminate such problems in the prior art, and to provide a high voltage semiconductor device which can attain high breakdown voltage isolation by a smaller area and does not increase the process cost.

According to an aspect of the present invention, a semiconductor device comprises a semiconductor substrate of a first conductivity type. At least one first region, having a relatively low impurity concentration, of a second conductivity type is formed on the primary surface of the semiconductor substrate. At least one second region, having a relatively high impurity concentration, of the second conductivity type is formed on the primary surface of the semiconductor substrate in contact with the first region. A third region of the second conductivity type is formed on the primary surface of the semiconductor substrate with a predetermined spacing to the second region. The third region has a relatively high impurity concentration. A fourth region of the second conductivity type is formed on the primary surface of the semiconductor substrate in contact with the third region and with a predetermined spacing to the first region. The fourth region has a relatively low impurity concentration. At least one conductive path is formed over the primary surface of the semiconductor substrate via an insulation layer, and the conductive path connects the second region and the third region.

According to an aspect of the present invention, a semiconductor device comprises a semiconductor substrate of a first conductivity type. A plurality of first regions of a second conductivity type are formed on the primary surface of the semiconductor substrate. The first regions have a relatively low impurity concentration. A plurality of second regions of the second conductivity type are formed on the primary surface of the semiconductor substrate in contact with the plurality of respective first regions. The second regions have a relatively high impurity concentration. A third region of the second conductivity type is formed on the primary surface of the semiconductor substrate with a predetermined spacing to the plurality of respective second regions. The third region has a relatively high impurity concentration. A fourth region of the second conductivity type is formed on the primary surface of the semiconductor substrate in contact with the third region, and formed with a predetermined spacing against the plurality of the first region. The fourth region has a relatively low impurity concentration. A plurality of conductive paths are formed over the primary surface of the semiconductor substrate via an insulation layer, and each of the conductive paths connects between one of the second regions and the third regions, respectively.

According to an aspect of the present invention, a semiconductor device comprises a semiconductor substrate of a first conductivity type. A plurality of first regions of a second conductivity type are formed on the primary surface of the semiconductor substrate. The first regions have a relatively low impurity concentration. A plurality of second regions of the second conductivity type are formed on the primary surface of the semiconductor substrate in contact with the plurality of respective first regions. The second regions have a relatively high impurity concentration. A third region of the second conductivity type having a region held between the plurality of second regions are formed with a predetermined spacing against the plurality of second regions. The third region has a relatively high impurity concentration. A fourth region of the second conductivity type, which has a region in contact with the third region being held between the plurality of first regions, is formed with a predetermined spacing against the plurality of first regions. The fourth region has a relatively low impurity concentration. A plurality of conductive paths are formed over the primary surface of the semiconductor substrate via an insulation layer, and connect between the plurality of second regions and the third regions.

In another aspect of the invention, in the semiconductor device as set forth above, the outer periphery of a region including the second and third regions is surrounded by a region including the first and fourth regions.

According to an aspect of the present invention, a semiconductor device comprises a semiconductor substrate of a first conductivity type. An annular first region of a second conductivity type is formed on the primary surface of the semiconductor substrate. The first region has a relatively low impurity concentration. An annular second region of the second conductivity type is formed on the primary surface of the semiconductor substrate in contact with the inside of the first region. The second region has a relatively high impurity concentration. A third region of the second conductivity type is formed on the primary surface of the semiconductor substrate with a predetermined spacing to the inside of the second region. The third region has a relatively high impurity concentration. A conductive path, which holds an insulation layer between the primary surface of the semiconductor substrate, is formed between the second and third regions.

In another aspect of the invention, each depletion layer of the pn junctions, which is formed respectively between the second region and the semiconductor substrate and between the third region and the semiconductor substrate, extends to contact each other, before any of the pn junctions reaches a critical field.

In another aspect of the invention, the density of electric force lines at the peripheral corner of each pn junction, which are formed respectively between the second region and the semiconductor substrate and between the third region and the semiconductor substrate, is equal to or less than that of electric force lines on the flat plane of the pn junctions.

In another aspect of the invention, the width of the primary surface of the semiconductor substrate between the second and third regions is formed to be equal to or less than 1.14 times the diffusion depth of the second region.

In another aspect of the invention, the punch through voltage between the second and third regions is formed to be equal to or less than the supply voltage of a control circuit formed on the third regions.

In another aspect of the invention, a field plate is disposed in the insulation layer between the primary surface of the semiconductor substrate and the conductive path, and the field plate is extends over the second and third regions.

In another aspect of the invention, the thickness of the insulation film between the field plate and the third region and the impurity concentration of the third region, are adjusted so that breakdown voltage by the insulation layer and the third region is larger than the supply voltage of a control circuit formed on the third region.

In another aspect of the invention, the impurity concentration of the third region is adjusted so that the interface field of the insulation film between the field plate and the third region does not reach the critical field.

In another aspect of the invention, the insulation layer and the impurity concentration of the third region are adjusted so that breakdown voltage by the insulation layer and the third region is larger than the supply voltage of a control circuit formed on the third region.

In another aspect of the invention, the impurity concentration of the third region is adjusted so that the interface field of the insulation layer does not reach the critical field.

Other features and advantages of the invention will be apparent from the following description.

BEST MODE FOR CARRYING OUT THE INVENTION

The First Embodiment

Figure 1:
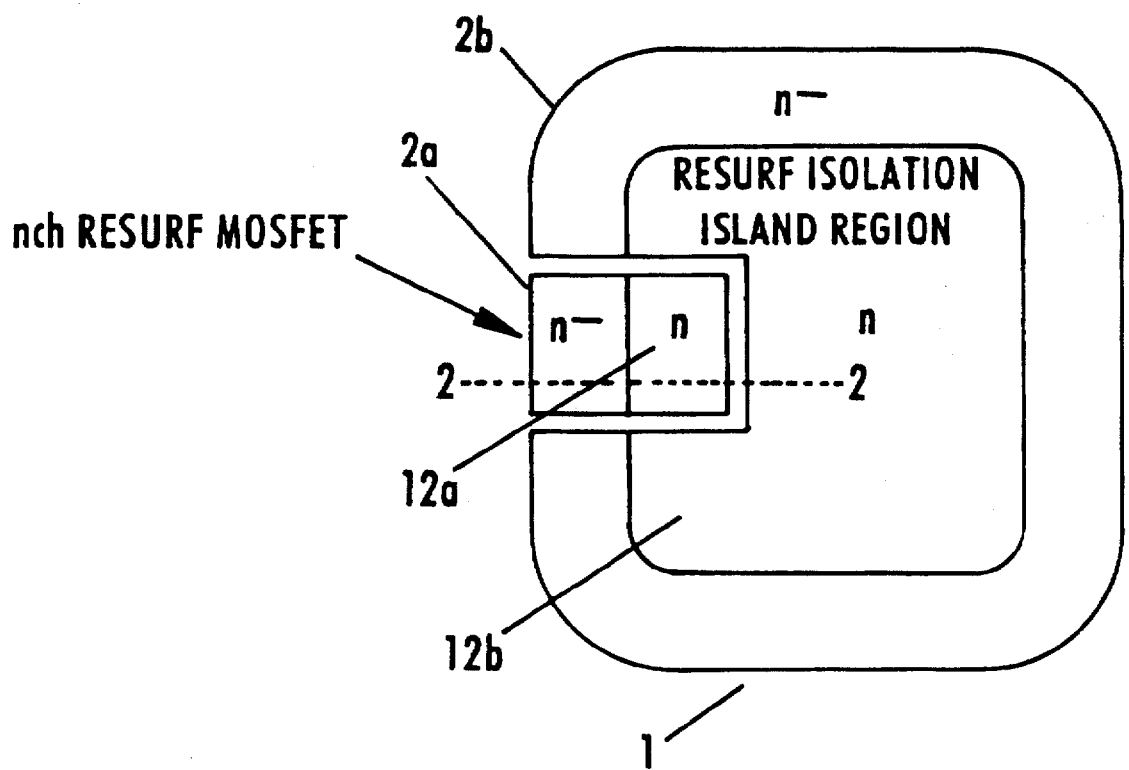
FIG. 1 is a plan view showing the arrangement of semiconductor regions of a semiconductor device according to the first embodiment of the present invention.
Figure 2:
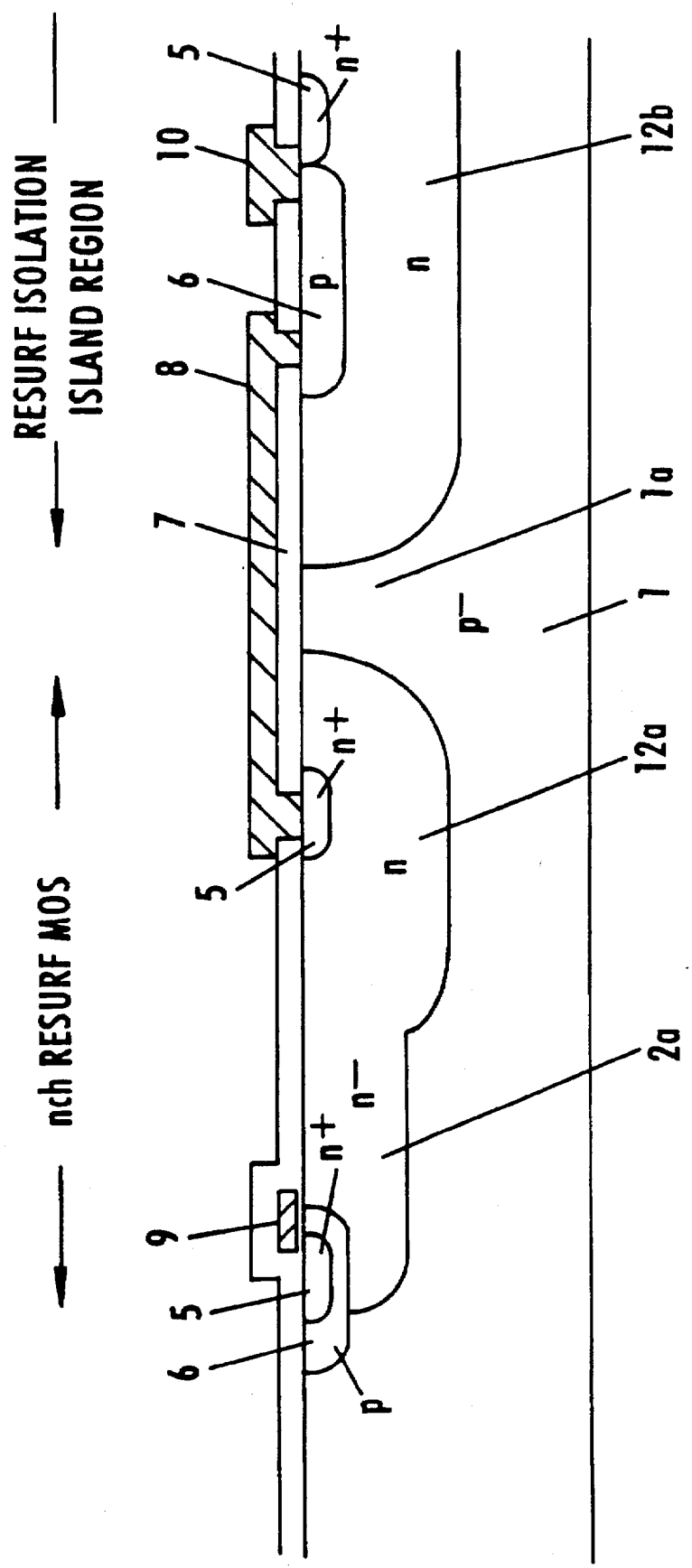
FIG. 2 is a cross-sectional view showing the structure taken along the line A—A in the plan view of FIG. 1.

FIG. 1 is a plan view showing the arrangement of semiconductor regions of a semiconductor device which has a level shift structure according to the first embodiment of the present invention. FIG. 2 is a cross-sectional view showing the structure taken along the line A—A in the plan view of FIG. 1.

First, as shown in the plan view of FIG. 1, the semiconductor device of the present invention constitutes a resurf structure in which n diffusion regions 12a and 12b are surrounded by n– diffusion regions 2a and 2b, and which is partially divided by a slit. In addition, as shown in the sectional view of FIG. 2, the semiconductor device consists of an n channel resurf MOS FET region shown in the left half of the figure and a resurf isolation island region in the right half of the figure. The semiconductor device comprises a p– silicon substrate 1 (semiconductor substrate), an n– diffusion region 2a (first region), an n diffusion region 5, a p diffusion region 6, an oxide film 7 (insulation layer), aluminum lead (conductive path) 8, a polysilicon gate 9, an aluminum electrode 10, an n diffusion region 12a (second region), and an n diffusion region 12b (third region). While an n– diffusion region 2b (fourth region) in FIG. 1 does not appear in FIG. 2, it is formed around the n diffusion region 12b in the same shape as the n– diffusion region 2a. In addition, the aluminum electrode 10 is formed in contact with the n diffusion region 5 and the p diffusion region 6, and is at the same potential as that of the resurf isolation island.

In the semiconductor device constituted as above, the n channel MOS FET is turned on by positively biasing the gate electrode 9. Thereby, a potential difference is caused between the electrode 10 and the aluminum lead 8 by a current flowing through the p diffusion region 6. Outputting this potential difference enables a logic signal applied to the gate 9 to be level shifted to higher potential.

The structure of the present invention differs from the conventional structure in that there is no resurf structure between the drain of the n channel resurf MOS FET (n– diffusion region 2a of FIG. 2) and the resurf isolation island region 12b, but the p– substrate region 1 is exposed on the surface with narrow width in the form of a slit-shaped region 1a.

Figure 3:
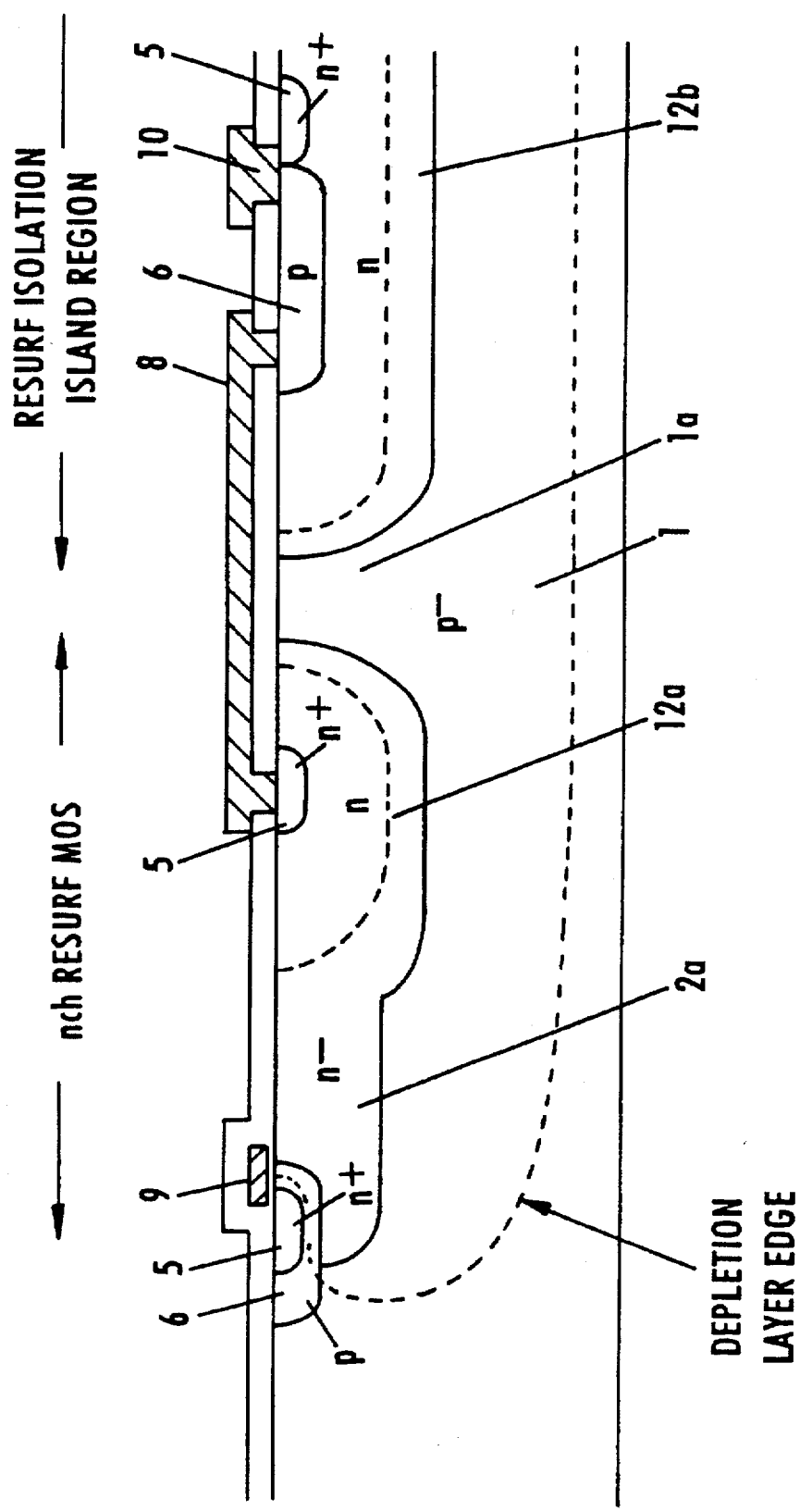
FIG. 3 shows equipotential lines in the structure shown in FIG. 1.

FIG. 3 shows equipotential lines in a case where the n diffusion region 12b is at a high potential in this structure.

As shown in FIG. 3, since the p– substrate region 1a positioned between the n diffusion regions 12a and 12b is depleted, no significant difference between the surface potential of the p– substrate region 1a and the n diffusion regions 12a and 12b arises. Accordingly, the potential difference is small between the aluminum lead 8 and the surface of the substrate silicon 1, eliminating the prior art problem of field concentration.

Further, a level shifted signal is output as a potential difference between the electrode 10 and the aluminum lead 8, which is the same potential difference between the n diffusion regions 12a and 12b (i.e. the potential difference between the n diffusion region 12a as the drain of the n channel MOS FET and the resurf isolation island region 12b). Therefore, a punch through voltage between the n diffusion regions 12a and 12b is required to be made higher than the output voltage. Generally, since the output voltage is detected by a control circuit, or the like, having low breakdown voltage included in the resurf isolation island region, the output voltage is designed to be equal to or less than the supply voltage of the control circuit.

From the above, the surface exposed region 1a of the p– substrate 1 should be designed to have a concentration and a distance which is depleted without lowering the resurf breakdown voltage, and which makes the punch through voltage between the n diffusion regions 12a and 12b not less than the supply voltage for the control circuit.

Figure 4:
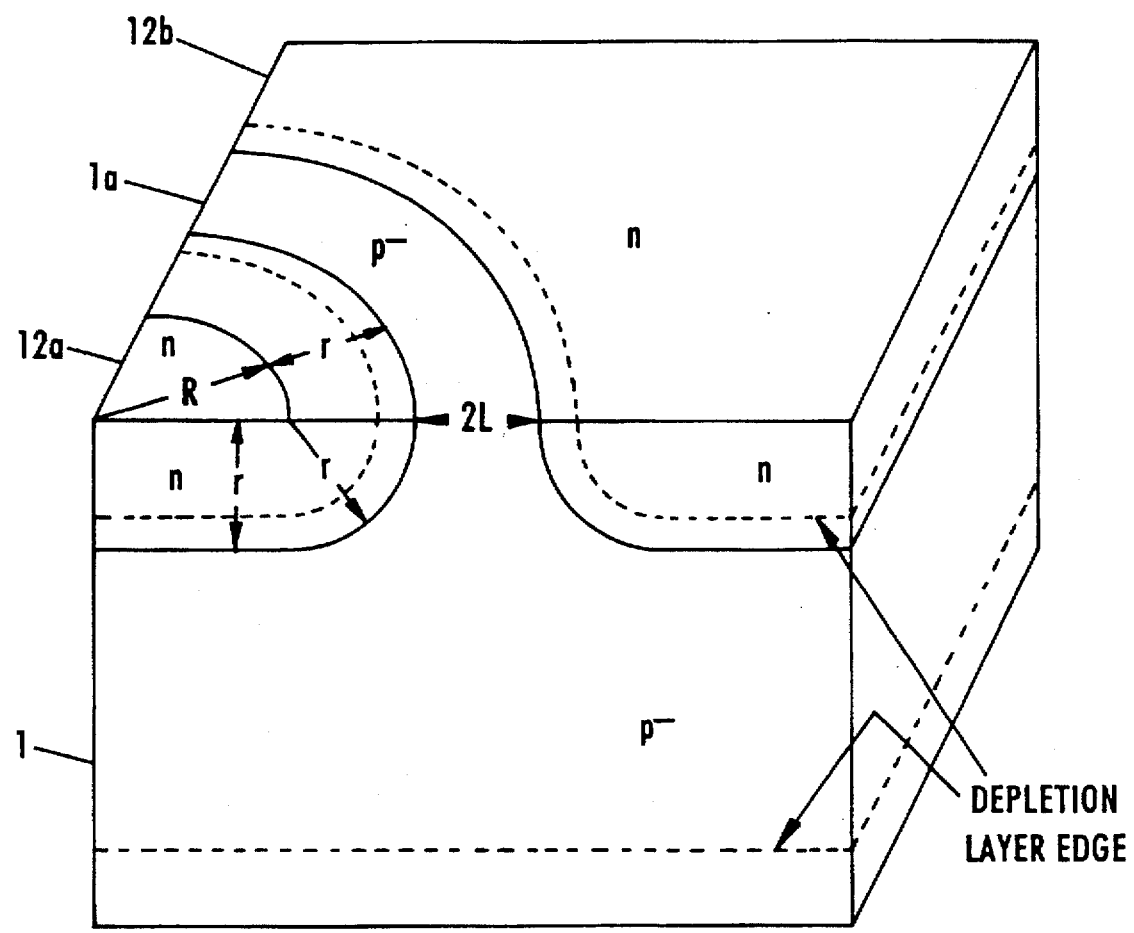
FIG. 4 schematically shows a structure of the corner region of the diffusion regions in the structure of FIG. 1.

This is analytically discussed. FIG. 4 schematically shows a corner region between the n diffusion regions 12a and 12b in a simplified manner for the analysis. As shown in FIG. 4, it is assumed that a pattern corner radius of the n diffusion region 12a is R, and the diffusion depth and lateral diffusion length of the n diffusion regions 12a and 12b is r.

A necessary condition, not affecting the resurf breakdown voltage, is that the pn junction field does not reach the critical field when the depletion layers extending from the n diffusion regions 12a and 12b at each end contact at the center. This condition on the pn junction field at the corner region is expressed in the form of equation (1) below. However, while actual extension of the depletion layers from the n diffusion regions 12a and 12b differ for the inside 12a and the outside 12b of the corner, it is assumed that they are substantially equal.

$$Ecr > E1 = L \cdot q \cdot Np/(\epsilon \cdot \epsilon') \times (L \cdot L/3 + r \cdot L + \pi \cdot R \cdot L/4)/((\pi \cdot R/2 + r) \cdot r) + 1) \quad (1)$$

where

Ecr: Critical field (about 2.5E5 V/cm)

E1: Pn junction field when depletion layers contact at the center q: Amount of charge of electron Np: Impurity concentration near surface of p– substrate 1

$\epsilon$: Dielectric constant of vacuum $\epsilon'$: Specific dielectric constant of silicon If R>>r, it is approximated by the following equation:

$$Ecr > E1 = L \cdot q \cdot Np/(\epsilon \cdot \epsilon') \cdot (L/(2 \cdot r) + 1) \quad (2)$$

Therefore, the pattern corner radius (R), the diffusion depth of n diffusion regions 12a and 12b (r), and the impurity concentration near the surface of p– substrate 1 (Np) are adjusted to satisfy equations (1) and (2).

Next, when the structure of FIG. 4 is employed, the breakdown voltage is generally reduced in comparison to the one-dimensional breakdown voltage between the p– substrate 1 and the n diffusion regions 12a and 12b. This is because electric force lines per unit area at the pn junction corner on the peripheral region of the n diffusion regions 12a and 12b become larger than those on the flat area of the pn junction, so that the electric field at the pn junction corner rises. If the pattern corner radius R of the n diffusion region 12a is sufficiently larger than the diffusion depth and lateral diffusion length r of the n diffusion region 12, the electric field at the pn junction corner is considered to be substantially proportional to:

(area of pn junction when viewing from surface)/(actual area of the pn junction).

Here, the actual area of the pn junction equals the sum of junction areas of the pn junctions of the n diffusion regions 12a and 12b, while the area of pn junction when viewing from the surface equals the sum of areas of the pn junctions at the corners of n diffusion regions 12a and 12b projected onto a flat plane, and the area on surface of p– substrate 1a (width of 2L) between them.

Therefore, it is sufficient to design this value to be equal to or less than 1, that is, the electric field at the pn junction corner should be equal to or less than that on the flat area of pn junction. This condition is expressed by equation (3)

$$1 \geq ((r+L) \cdot (r+L) + 2R \cdot (r+L))/(2 \cdot r \cdot (\pi \cdot R/2 + r)) \quad (3)$$

If R>>r, then $$1 \geq 2 \cdot (r+L)/(\pi \cdot r) \quad (4)$$

thus $$2L \geq (\pi - 2) \cdot r \quad (5)$$

It is found that the width of p– substrate 1 on the surface (width of slit-shaped p– substrate 1a (2L)) should be equal to or less than about $(\pi - 2)$ times the diffusion depth (r) of n diffusion regions 12a and 12b.

Figure 5:
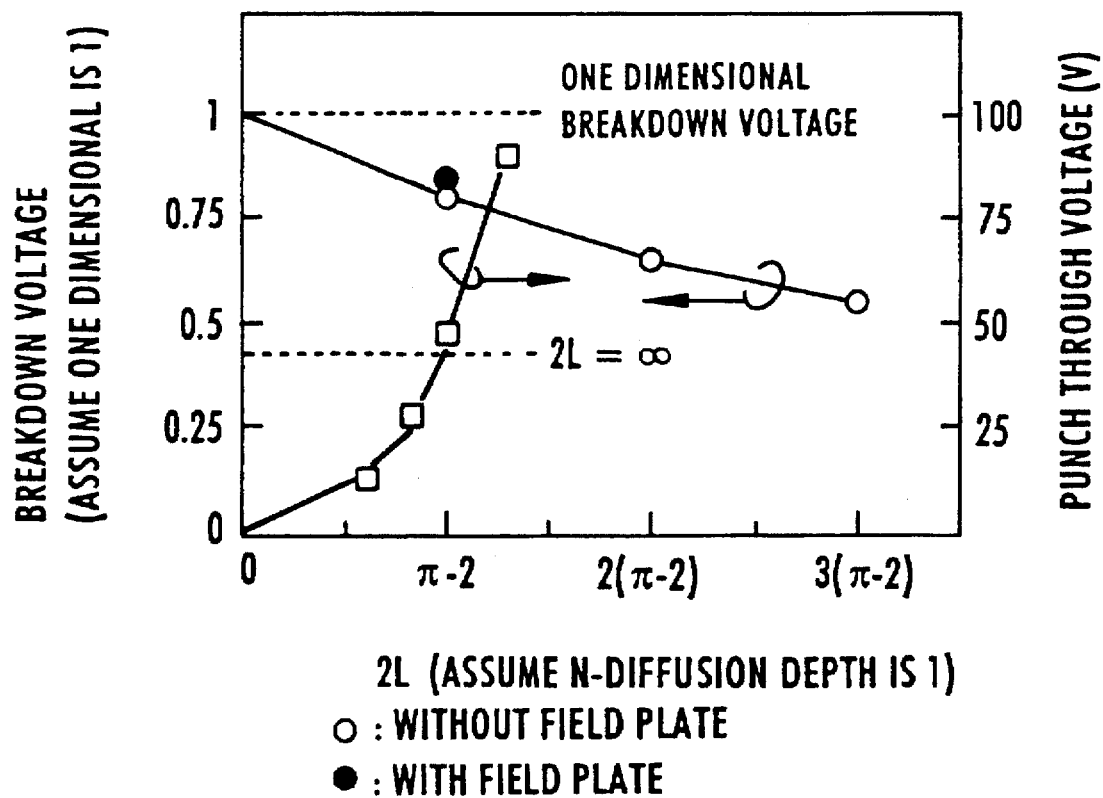
FIG. 5 shows the result of simulation on the breakdown voltage and punch through voltage in the structure of FIG. 4.

The result of this analysis confirmed by two-dimensional simulation for R>>r is shown in FIG. 5. As seen from the figure, when width 2L on the surface of p– substrate 1 becomes larger than about $(\pi - 2)$ times the diffusion depth (r) of n diffusion region 12, the breakdown voltage at the corner of the pn junction becomes less than 80% of the one-dimensional breakdown voltage. In addition, it is found that, when L is sufficiently large (2L =∞), the breakdown voltage is reduced to 43% of the one-dimensional breakdown voltage.

Then, from the above discussion, the punch through voltage V between the n diffusion regions 12a and 12b when the depletion layer is extended by 2L should be higher than the supply voltage Vc of the control circuit in the resurf isolation island region. When this is approximated by the one-dimensional step junction, it is expressed by the following equation.

$$Vc < V = 2L \cdot L \cdot q \cdot Np/(\epsilon \cdot \epsilon')(1 + Np/Nn) \quad (6)$$

where:

q: Amount of charge of electron

Nn: Impurity concentration in n diffusion regions 12a and 12b near the pn junction Np: Impurity concentration near the surface of p– substrate 1

ε: Dielectric constant of vacuum

ε': Specific dielectric constant of silicon

Therefore, the width of p– substrate 1a (2L), the impurity concentration near the surface of p– substrate 1a (Np), and the impurity concentration in the n diffusion regions 12a and 12b near the pn junction (Nn) are adjusted to satisfy the equation (6).

FIG. 5 also shows the result of simulation on the punch through voltage. When the width on the surface of p– substrate 1 (2L) is (π–2) times the diffusion depth (r) of n diffusion regions 12a and 12b, the punch through voltage rises to 50 V, which is a value sufficiently higher than the supply voltage of a typical control circuit. Therefore, it is also found from this value that width 2L of the p– substrate 1a at the slit should be designed to be equal to or less than (π–2) times the diffusion depth (r) of n diffusion region 12, that is, to be equal to or less than 1.14 times the depth of the n diffusion region.

With the structure of the semiconductor device according to this embodiment, level shift can be attained by forming the n– diffusion region 2a as a level shift element only on one side of the resurf isolation island 12b. Accordingly, the area of device can be significantly reduced. In addition, since there is no need to change the process, there is no increase of process cost.

The Second Embodiment

Figure 6:
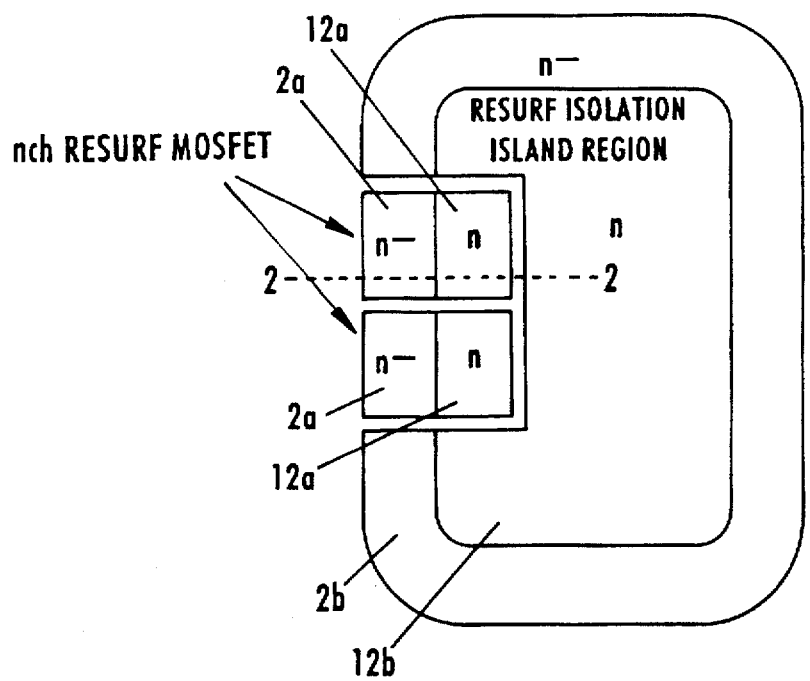
FIG. 6 is a plan view showing the arrangement of semiconductor regions for the semiconductor device according to the second embodiment of the present invention.

FIG. 6 is a plan view showing the arrangement of semiconductor regions for the semiconductor device according to the second embodiment of the present invention. The cross-sectional structure taken at line A—A in FIG. 6 is similar to that in FIG. 2, and, therefore, its figure and description are omitted. In the semiconductor device of the second embodiment, as shown by the plan view of FIG. 6, two n– diffusion regions 2a (first regions) are formed on a p– silicon substrate 1 (semiconductor substrate) separated by a predetermined spacing, and two n diffusion regions 12a (second regions) are formed respectively in contact with either of the n– diffusion regions 2a, and oppose each other with a predetermined spacing. In addition, an n diffusion region (third region) 12b is formed with a predetermined spacing to two n diffusion regions (second regions) 12a. Then, an n– diffusion region (fourth region) 2b is formed on the periphery of the n diffusion region 12b, and opposes the n– diffusion regions 2a (first regions) with a predetermined spacing. In the figure, the reference numerals correspond to the same reference numerals represented in FIGS. 1 and 2.

In the structure of the second embodiment as stated above, a plurality of small regions 12a are divided from the n resurf isolation island 12b and disposed with spacing, and are separated by each other with spacing. Then, the region including respective two n diffusion regions (second region) 12a and n diffusion region (third region) 12b is surrounded by a region including the n– diffusion region 2a (first region) and the n– diffusion region 2b (fourth region).

As described, the second embodiment incorporates two, and generally, a plurality of n channel resurf MOS FETs. With such an arrangement, a plurality of level shift elements can be connected to one resurf isolation island region. Except for such point, functions and effects for isolating high voltage in this semiconductor device are the same as those of the first embodiment shown in FIGS. 1 and 2. Therefore, a detailed description is omitted here. In the structure of this second embodiment, since the resurf MOS FETs may be provided only on one side of the resurf isolation island, increase of device area is suppressed.

The Third Embodiment

Figure 7:
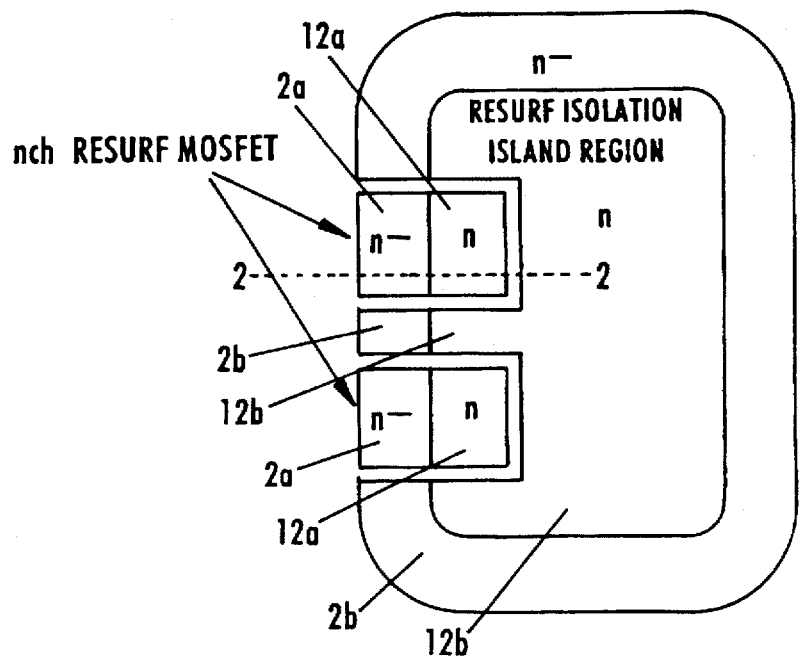
FIG. 7 is a plan view showing the arrangement of semiconductor regions for the semiconductor device according to the third embodiment of the present invention.

FIG. 7 is a plan view showing the arrangement of semiconductor regions for the semiconductor device according to the third embodiment of the present invention. The cross-sectional structure taken at line A—A in FIG. 7 is similar to that in FIG. 2, and, therefore, its figure and description are omitted. In the semiconductor device of the third embodiment, as shown by the plan view of FIG. 7, two n– diffusion regions 2a (first regions) separated by a predetermined spacing are formed on a p– silicon substrate 1 (semiconductor substrate), and two n diffusion regions 12a (second regions) are formed in contact with them respectively, and oppose each other with a predetermined spacing. An n diffusion region (third region) 12b is formed with a predetermined spacing to two n diffusion regions (second regions) 12a, a portion of which extends between two n diffusion regions (second regions) 12a. Then, an n– diffusion region (fourth region) 2b is formed on the periphery of the n diffusion region 12b, and opposes to the n– diffusion regions 2a (first region) with a predetermined spacing. In addition, the separate portion of the n– diffusion region (fourth region) 2b is disposed between two n– diffusion regions 2a (first regions) with a predetermined spacing between them, continuing from the n diffusion region (third region) 12b between two n diffusion regions (second regions) 12a.

The semiconductor device of the third embodiment can be considered a plurality of n channel resurf MOS FETs as shown in the device of the first embodiment shown in FIGS. 1 and 2 and are formed in different locations of one resurf isolation island.

Thus, the third embodiment incorporates a plurality of n channel resurf MOS FETs. A difference from the second embodiment lies in that the n– diffusion region 2b is formed in contact with the n diffusion region 12b of the resurf isolation island between two n channel result MOS FETs. With such an arrangement, a plurality of level shift elements can be connected to one resurf isolation island region. In addition, since the resurf MOS FETs are provided only on one side of the resurf isolation island, an increase of device area can be suppressed. Furthermore, it is possible to prevent parasitic operations caused by a parasitic element L-npn (lateral transistor structure) between two n channel resurf MOS FETs.

While the example of FIG. 7 has two sets of level shift functions by the n channel result MOS FETs, they may be appropriately provided in multiple sets, as required.

The Fourth Embodiment

Figure 8:
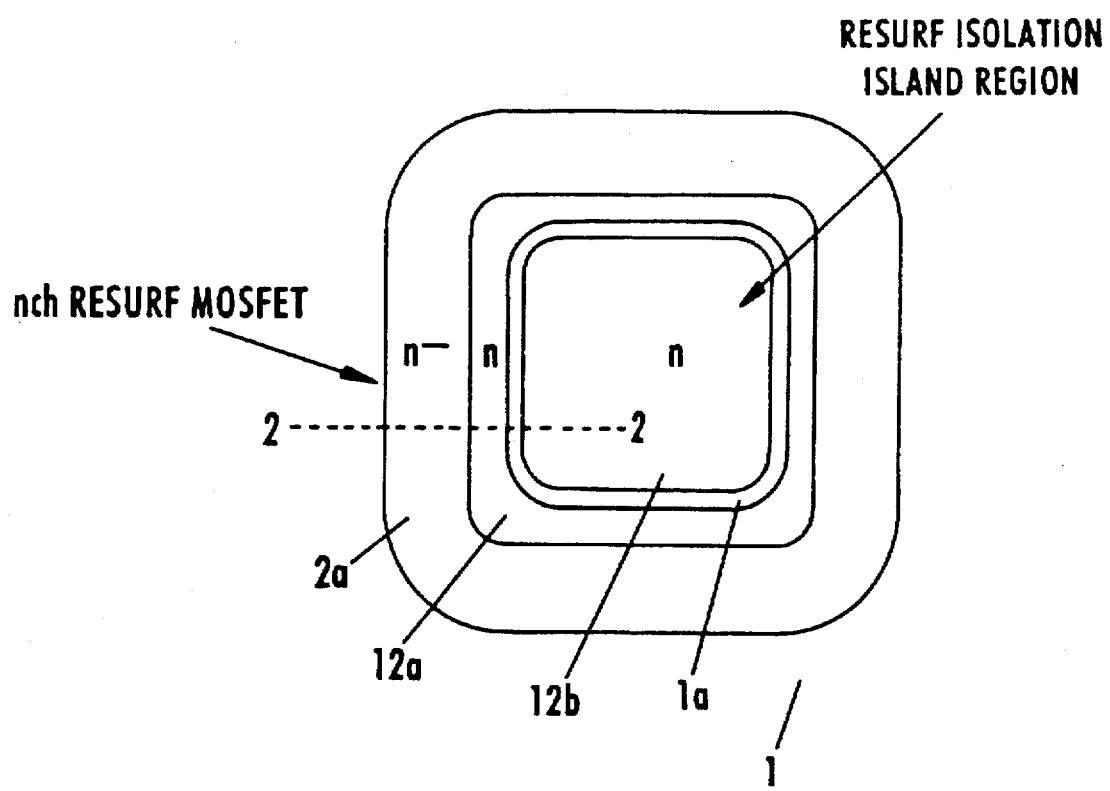
FIG. 8 is a plan view showing the arrangement of semiconductor regions for the semiconductor device according to the fourth embodiment of the present invention.

FIG. 8 is a plan view showing the arrangement of semiconductor regions for the semiconductor device having a level shift structure according to the fourth embodiment of the present invention. The cross-sectional structure at line A—A in FIG. 8 is similar to that in FIG. 1, and, therefore, its figure and description are omitted.

In the semiconductor device of the fourth embodiment, as shown in the plan view of FIG. 8, an n– diffusion region 2a (first region) is annularly formed on a p– silicon substrate 1 (semiconductor substrate), and an n diffusion region (second region) 12a is annularly formed in contact with the inner periphery of the n– diffusion region 2a. In addition, in the inside of the n diffusion region 12a, an island-shaped n diffusion region 12b is formed with a p– substrate 1a of a predetermined width inbetween.

Thus, the device of the fourth embodiment differs from the first embodiment in that the spacing between the n diffusion regions 12a and 12b is annularly formed, and the n diffusion region 2a is not divided. Except for such point, functions of the device of the fourth embodiment are the same as those shown in FIG. 1. Therefore, detailed description is omitted here. Although the structure of the first embodiment shown in FIGS. 1 and 2 has a possibility of reduction of breakdown voltage because of isolation of the n− diffusion region 2a, the structure of this embodiment has no possibility due to division of the n− diffusion region 2a.

The Fifth Embodiment

Figure 9:
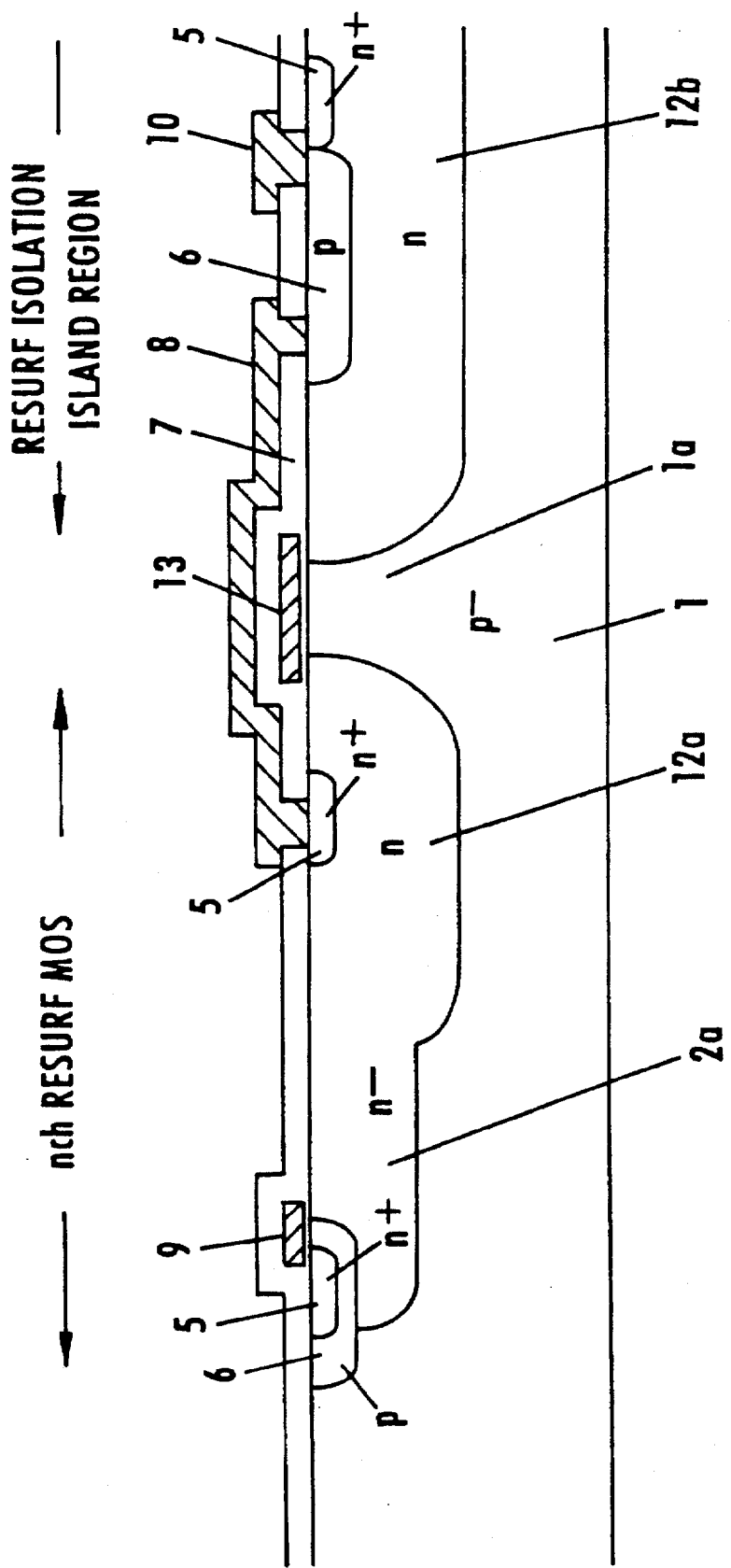
FIG. 9 is a view showing the cross-sectional structure of a semiconductor device according to the fifth embodiment of the present invention.

FIG. 9 is a view showing the cross-sectional structure of a semiconductor device having a level shift structure according to the fifth embodiment of the present invention. The structure of semiconductor regions of the semiconductor device in a plan view according to the fifth embodiment is the same as FIG. 1, therefore, its figure and description are omitted. FIG. 9 shows a cross-sectional view taken along the line A—A in FIG. 1. The semiconductor device of the fifth embodiment comprises, as shown by the sectional structure of FIG. 9, a p− silicon substrate 1 (semiconductor substrate), an n− diffusion region 2a (first region), an n diffusion region 5, a p diffusion region 6, an oxide film 7 (insulation layer), aluminum lead 8 (conductive path), a polysilicon gate 9, an aluminum electrode 10 formed in contact with the n diffusion region 5 and the p diffusion region 6, and has the same potential as an island potential, an n diffusion region 12a (second region), and an n diffusion region 12b (third region). In addition, although the n− diffusion region 2b (fourth region) of FIG. 1 is not shown in FIG. 9, it is formed on the periphery of the n diffusion region 12b in the same manner as the n− diffusion region 2a. Since these elements are the same as those in FIG. 1, a description of the elements is omitted.

Further, in the fifth embodiment, in addition to the structure of the first embodiment, a polysilicon 13 (at the same potential as the n diffusion region 12a of the n channel resurf MOS FET) is disposed in the oxide film 7 so as to cover the region 1a exposed on the surface of the p− substrate 1, holding the underlying oxide film (called an oxide film 7a (insulation film)) therebetween. The polysilicon 13 is held at the same potential as the n diffusion region 12a of the n channel resurf MOS FET. Then, the polysilicon 13 covers pn junctions formed between the n diffusion regions 12a and 12b, and the p− substrate 1, and extends over the n diffusion regions 12a and 12b. With this formation, in the level shift operation, punch through between the n diffusion regions 12a and 12b, that is, punch through between the n diffusion region 12a of the n channel MOS drain and the n diffusion region 12b of the resurf isolation island can be prevented by a field plate effect of the polysilicon layer 13.

Figure 10:
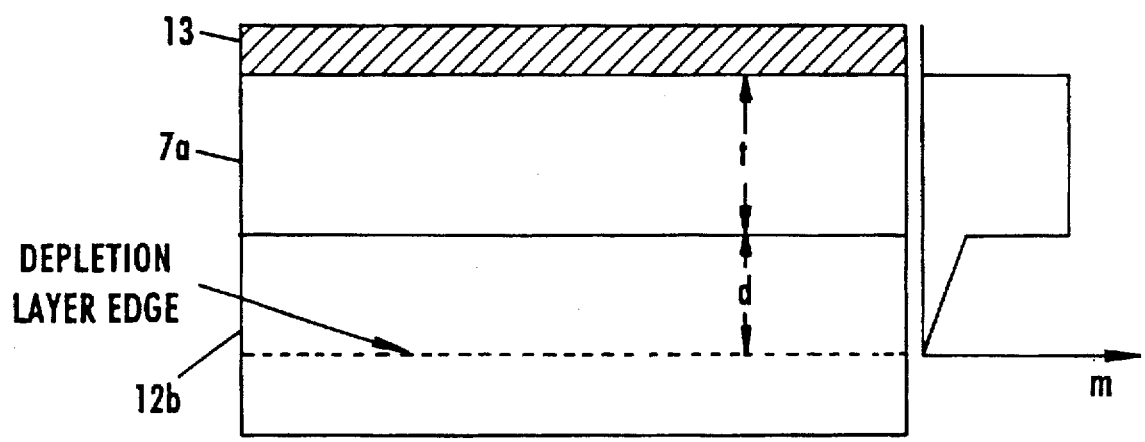
FIG. 10 shows a partial enlarged view of a structure according to the fifth embodiment of the present invention.

However, if the oxide film 7a under the polysilicon 13 is too thin, field concentration may occur on the Si surface under the polysilicon 13 so that the breakdown voltage may be reduced. Therefore, the following conditions should be satisfied. First, FIG. 10 shows in a larger scale a structure in which the polysilicon 13 opposes the n diffusion region 12b on the resurf isolation island with the oxide film 7a therebetween. The field distribution is also shown. It is assumed that the thickness of the oxide film 7a under the polysilicon 13 is t, while the thickness of the depletion layer extending into the n diffusion region 12b is d. Breakdown voltage by the silicon oxide film 7a and the n diffusion region 12b must be higher than the supply voltage Vc of the control circuit. Thus, the following equation (7) is obtained.

$$Vc < q \cdot Nn \cdot d/(\epsilon \cdot \epsilon') \cdot (\epsilon' \cdot t/\epsilon ox + d/2) \quad (7)$$

In addition, since the electrical field at the interface of silicon oxide film 7a must be the critical voltage Ecr' or lower, the following equation (8) is obtained.

$$Ecr' > q \cdot Nn \cdot d/(\epsilon \cdot \epsilon') \quad (8)$$

In these equations,

Ecr': Critical field at the interface of silicon and silicon oxide film (about 5E5V/cm)

q: Amount of charge of electron

Nn: Impurity concentration in n diffusion region 12b

ϵ: Dielectric constant of vacuum

ϵ': Specific dielectric constant of silicon

ϵox: Specific dielectric constant of oxide film d: Width of depletion layer just under end of polysilicon 13 t: Thickness of oxide film just under end of polysilicon 13

In most cases, the field plate 13 extends to a region where the impurity concentration in the n diffusion region 12b (Nn) is high, as a result, it can be expected that the depletion layer d becomes considerably small. Thus, it is generally desirable that the value of first term in the right side of the equation (7) is larger than the control voltage Vc. That is, $$Vc < q \cdot Nn \cdot d/(\epsilon \cdot \epsilon') \cdot (\epsilon' \cdot t/\epsilon ox)$$

Thus, $$Vc < q \cdot Nn \cdot d \cdot t/\epsilon \cdot \epsilon ox \quad (9)$$

The thickness of the oxide film just under the end of polysilicon 13 (t) and the impurity concentration in the n diffusion region 12b (Nn) are adjusted to satisfy equations (7)–(9).

Figure 11A:
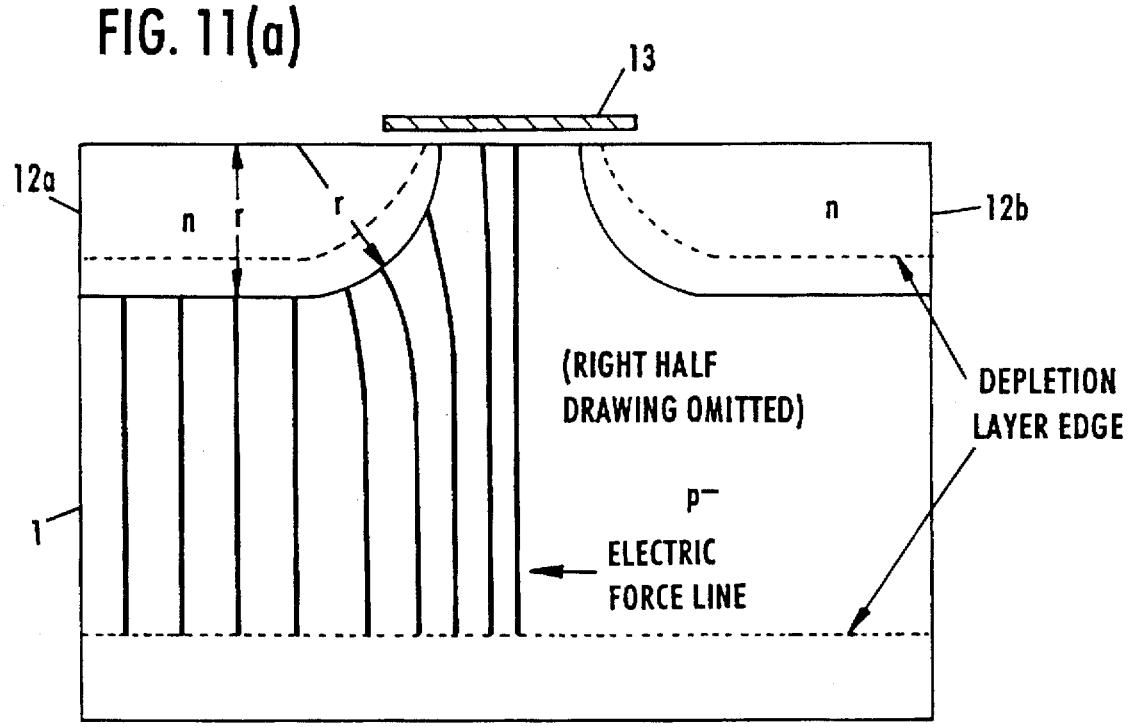
FIG. 11(a) and FIG. 11(b) illustrate electric force lines in a region of level shift structure according to the fifth embodiment of the present invention.
Figure 11B:
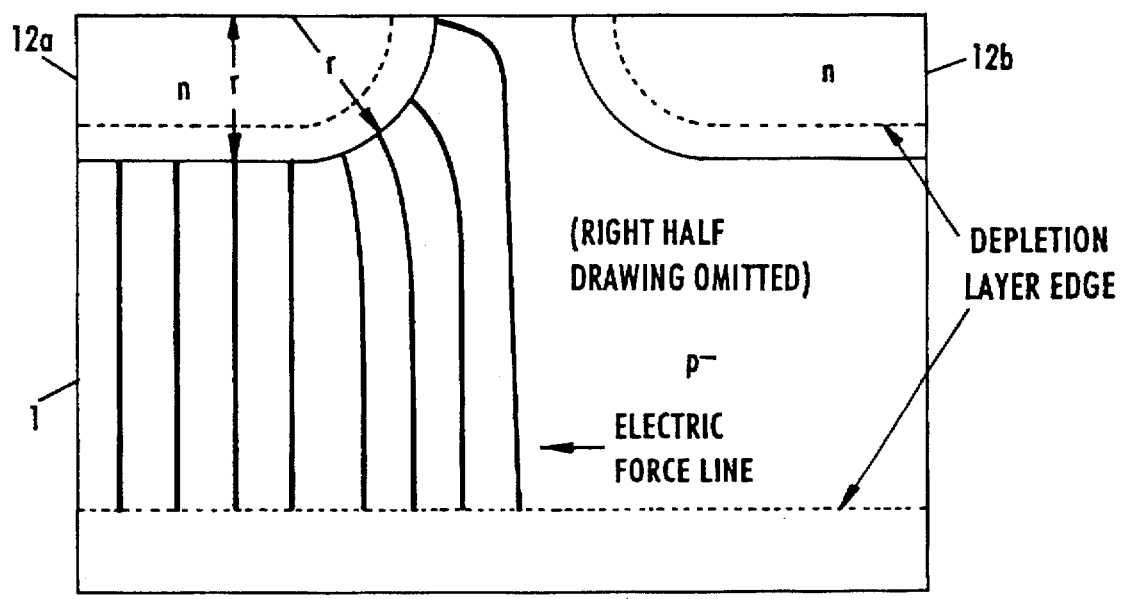
Figure 12:
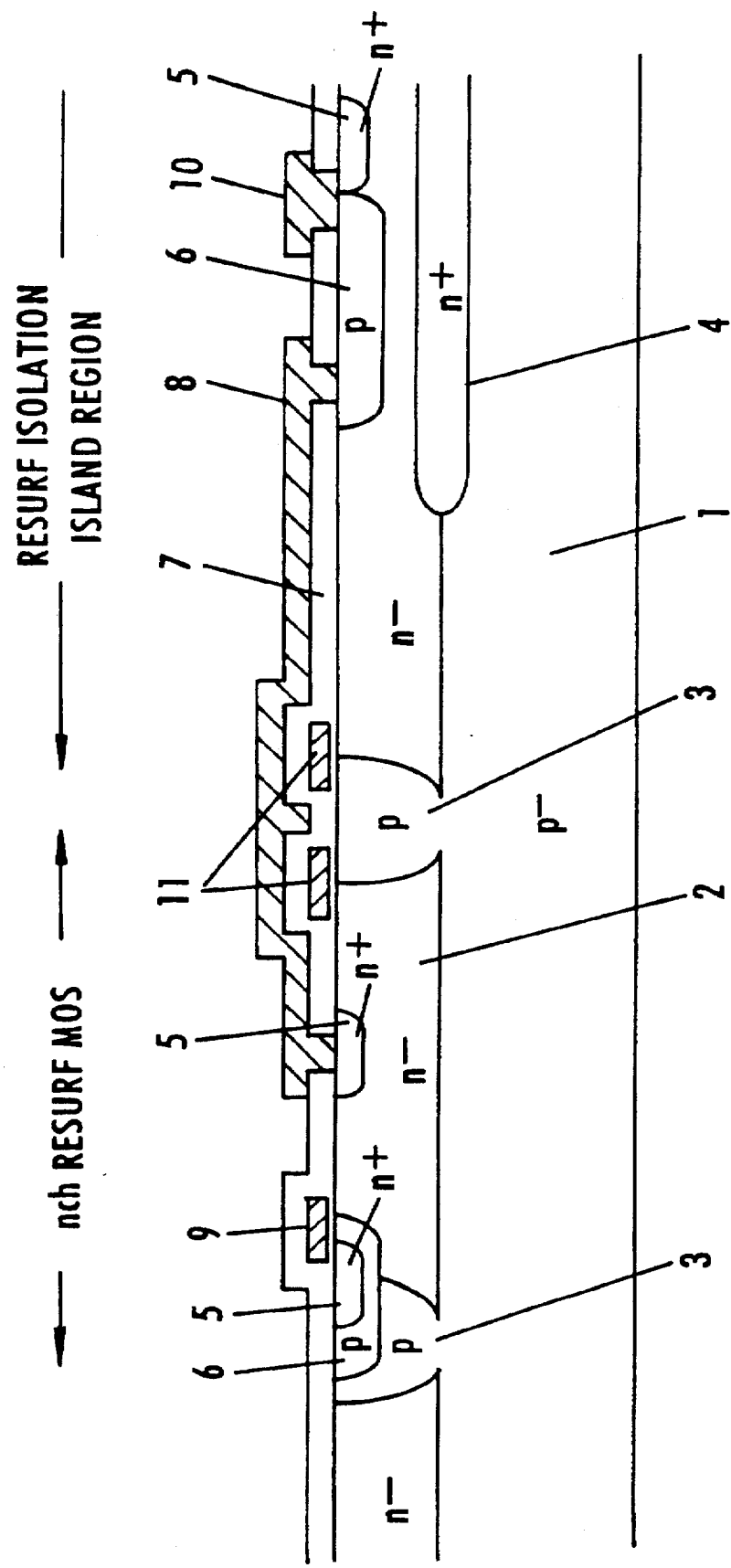
FIG. 12 is a sectional view of a conventional semiconductor device with a level shift function.

In addition, FIG. 11 (a) shows a state of electric force lines in a case where the polysilicon 13 is formed to cover the p− substrate 1a as shown in FIG. 9, in comparison with FIG. 11 (b) where there is no polysilicon 13. As shown in FIG. 11(a), parts of the electric force lines terminate on the polysilicon 13 because the polysilicon 13 is over the surface region of p− substrate 1a, so that the electric field is relaxed at the pn junction corner. This further prevents the breakdown voltage between the p− substrate 1 and the n diffusion region 12a and 12b from being reduced.

FIG. 5 also shows the result of simulation on the breakdown voltage when the field plate 13 exists. It is 85% of one-dimensional breakdown voltage, and the breakdown voltage is improved by 6over the case where there is no field plate. With this arrangement, it is possible to further improve the breakdown voltage and the punch through voltage in addition to the advantages of the first embodiment.

Furthermore, the device of FIG. 9 is an example in which a field plate 13 is added to the device of the first embodiment shown in FIGS. 1 and 2. The field plate is also applicable to the devices of the second through fourth embodiments shown in FIGS. 6 through 8.

The above analysis is directed to the polysilicon 13 disposed in the oxide film 7, the oxide film 7a and the n diffusion region 12b thereunder. The same analysis is applied to the breakdown voltage of the aluminum lead 8, the oxide film 7 and the n diffusion region 12b in the devices of the first through fourth embodiments shown in FIGS. 1 through 8. That is, in these cases, the thickness of oxide film (t) just under the aluminum lead 8 and the impurity concentration of the n diffusion region 12b (Nn) are adjusted to satisfy the conditions of equations 7 through 9.

As described above, the present invention can provide a semiconductor device having a high voltage isolation region between a low breakdown voltage region and a high breakdown voltage region, and has a level shift function to the high breakdown voltage region. The high voltage semiconductor device according to the present invention can be obtained within a small area and without increasing the process cost.

Obviously, many modifications and variations of the present invention are possible in light of the above teachings. It is, therefore, to be understood that, within the scope of the appended claims, the invention may be practiced otherwise than as specifically described.

We claim:

1. A semiconductor device comprising:
   a semiconductor substrate of a first conductivity type;
   at least one first region of a second conductivity type formed on the primary surface of said semiconductor substrate, and having a first impurity concentration;
   at least one second region of the second conductivity type formed on the primary surface of said semiconductor substrate in contact with said first region, and having a second impurity concentration greater than the first impurity concentration;
   a third region of the second conductivity type formed on the primary surface of said semiconductor substrate with a predetermined spacing to said second region, and having a third impurity concentration greater than the first impurity concentration;
   a fourth region of the second conductivity type formed on the primary surface of said semiconductor substrate in contact with said third region and with a predetermined spacing to said first region, and having a fourth impurity concentration less than the second impurity concentration and less than the third impurity concentration; and
   at least one conductive path formed over the primary surface of said semiconductor substrate via an insulation layer, and connecting said second region and said third region.

2. A semiconductor device as set forth in claim 1, wherein the outer periphery of a region including said second and third regions is surrounded by a region including said first and fourth regions.

3. A semiconductor device as set forth in claim 1, wherein, each depletion layer of the pn junctions formed respectively between said second regions and said semiconductor substrate and between said third region and said semiconductor substrate extends to contact each other, before any of said pn junctions reaches a critical field.

4. A semiconductor device as set forth in claim 1, wherein the density of electric force lines at the peripheral corner of each pn junction formed respectively between said second region and said semiconductor substrate and between said third region and said semiconductor substrate is equal to or less than that of electric force lines on the flat plane of said pn junctions.

5. A semiconductor device as set forth in claim 1, wherein the width of primary surface of said semiconductor substrate between said second and third regions is formed to be equal to or less than 1.14 times the diffusion depth of the second region.

6. A semiconductor device as set forth in claim 1, wherein the punch through voltage between said second and third regions is formed to be equal to or less than the supply voltage of a control circuit formed on said third regions.

7. A semiconductor device as set forth in claim 1, wherein a field plate is disposed in said insulation layer between the primary surface of said semiconductor substrate and said conductive path, said field plate is extending over said second and third regions.

8. A semiconductor device as set forth in claim 7, wherein the thickness of the insulation film between said field plate and said third region and the third impurity concentration are adjusted so that breakdown voltage by said insulation layer and said third region is larger than the supply voltage of a control circuit formed on said third region.

9. A semiconductor device as set forth in claim 7, wherein the third impurity concentration is adjusted so that the interface field of the insulation film between said field plate and said third region does not reach the critical field.

10. A semiconductor device as set forth in claim 1, wherein said insulation layer and the third impurity concentration are adjusted so that breakdown voltage by said insulation layer and said third region is larger than the supply voltage of a control circuit formed on said third region.

11. A semiconductor device as set forth in claim 1, wherein the third impurity concentration is adjusted so that the interface field of said insulation layer does not reach the critical field.

12. A semiconductor device comprising:
    a semiconductor substrate of a first conductivity type;
    a plurality of first regions of a second conductivity type formed on the primary surface of said semiconductor substrate with a predetermined spacing between each other, and having a first impurity concentration;
    a plurality of second regions of the second conductivity type formed on the primary surface of said semiconductor substrate in contact with said plurality of respective first regions with a predetermined spacing between each other, and having a second impurity concentration greater than the first impurity concentration;
    a third region of the second conductivity type formed on the primary surface of said semiconductor substrate with a predetermined spacing to said plurality of respective second regions, and having a third impurity concentration greater than the first impurity concentration;
    a fourth region of the second conductivity type formed on the primary surface of said semiconductor substrate in contact with said third region and formed with a predetermined spacing against said plurality of first region, and having a fourth impurity concentration less than the second impurity concentration and less than the third impurity concentration; and
    a plurality of conductive paths formed over the primary surface of said semiconductor substrate via an insulation layer, and connecting between said plurality of second regions and said third region, respectively.

13. A semiconductor device comprising:
    a semiconductor substrate of a first conductivity type;
    a plurality of first regions of a second conductivity type formed on the primary surface of said semiconductor substrate, and having a first impurity concentration;
    a plurality of second regions of the second conductivity type formed on the primary surface of said semiconductor substrate in contact with said plurality of respective first regions, and having a second impurity concentration greater than the first impurity concentration;
    a third region of the second conductivity type having a region held between said plurality of second regions, formed with a predetermined spacing against said plurality of second regions, and having a third impurity concentration greater than the first impurity concentration;

a fourth region of the second conductivity type having a region in contact with said third region and held between said plurality of first regions, formed with a predetermined spacing against said plurality of first regions, and having a fourth impurity concentration less than the second impurity concentration and less than the third impurity concentration; and a plurality of conductive paths formed over the primary surface of said semiconductor substrate via an insulation layer, and connecting between said plurality of second regions and said third region.

14. A semiconductor device comprising:

a semiconductor substrate of a first conductivity type;

an annular first region of a second conductivity type formed on the primary surface of said semiconductor substrate, and having a first impurity concentration;

an annular second region of the second conductivity type formed on the primary surface of said semiconductor substrate in contact with the inside of said first region, and having a second impurity concentration greater than the first impurity concentration;

a third region of the second conductivity type formed on the primary surface of said semiconductor substrate with a predetermined spacing to the inside of said second region, and having a third impurity concentration greater than the first impurity concentration; and a conductive path holding an insulation layer between the primary surface of said semiconductor substrate and formed between said second and third regions.

* * * * *